United States Patent
Wu et al.

[11] Patent Number: 6,071,806
[45] Date of Patent: Jun. 6, 2000

[54] METHOD FOR PREVENTING POISONED VIAS AND TRENCHES

[75] Inventors: Kun-Lin Wu, Taichung; Horng-Bor Lu, Hsinchu, both of Taiwan

[73] Assignee: United Microelectronics Corp., Hsinchu, Taiwan

[21] Appl. No.: 09/152,921

[22] Filed: Sep. 14, 1998

[30] Foreign Application Priority Data

Jul. 28, 1998 [TW] Taiwan ................................. 87112282

[51] Int. Cl.$^7$ .............................................. H01L 21/4763
[52] U.S. Cl. ......................... 438/622; 438/624; 438/637; 438/671
[58] Field of Search ........................... 438/622, 624, 438/637, 611

[56] References Cited

U.S. PATENT DOCUMENTS

| | | | |
|---|---|---|---|
| 4,789,648 | 12/1988 | Chow et al. ........................ | 437/225 |
| 4,948,755 | 8/1990 | Mo ....................................... | 437/195 |
| 5,354,711 | 10/1994 | Heitzmann et al. ................ | 437/182 |
| 5,538,922 | 7/1996 | Cooper et al. ...................... | 437/195 |
| 5,578,523 | 11/1996 | Fiordalice et al. ................. | 437/190 |
| 5,612,254 | 3/1997 | Mu et al. ............................. | 437/195 |
| 5,635,423 | 6/1997 | Huang et al. ....................... | 437/195 |
| 5,691,238 | 11/1997 | Avanzino et al. ................... | 437/195 |
| 5,739,579 | 4/1998 | Chiang et al. ...................... | 257/635 |
| 5,817,572 | 10/1998 | Chiang et al. ...................... | 438/624 |
| 5,877,229 | 3/1999 | Janke et al. ......................... | 522/31 |
| 5,965,679 | 10/1999 | Godschalx et al. ................. | 536/281 |
| 6,004,883 | 12/1999 | Yu et al. .............................. | 438/706 |
| 6,007,733 | 12/1999 | Jang et al. .......................... | 216/80 |
| 6,025,264 | 2/2000 | Yew et al. ........................... | 438/627 |

*Primary Examiner*—John F. Niebling
*Assistant Examiner*—Lynne A. Gurley
*Attorney, Agent, or Firm*—Thomas, Kayden, Horstemeyer & Risley

[57] ABSTRACT

A method for preventing the occurrence of poisoned trenches and vias in a dual damascene process that includes performing a densification process, such as an electron-beam process, on the surface of the exposed dielectric layer around the openings before the openings are filled with conductive material. The densified surface of the dielectric layer is able to efficiently prevent the occurrence of poisoned trenches and vias caused by the outgassing phenomena.

20 Claims, 4 Drawing Sheets

METHOD FOR PREVENTING POISONED VIAS AND TRENCHES

CROSS-REFERENCE TO RELATED APPLICATION

This application claims the priority benefit of Taiwan application serial no. 87112282, filed Jul. 28, 1998, the full disclosure of which is incorporated herein by reference.

BACKGROUND OF THE INVENTION

1. Field of the Invention

This invention relates to a method for fabricating multi-level interconnects, and more particularly, to a method for preventing the occurrence of poisoned vias and trenches.

2. Description of Related Art

A dual damascene process is a technique, which imbeds interconnects into an insulator, includes forming an insulator, planarizing and patterning the insulator to form trenches and via holes, and filling the trenches and via holes with metal to form conducting wires and via plugs. A final chemical mechanical polishing process is then performed to planarize the surface of a device. Because a dual damascene process prevents the occurrence of overlay error and process bias of a conventional metalization process, it has been widely applied on semiconductor processes to improve the reliability of devices.

FIGS. 1A through 1D are cross-sectional views showing a conventional method for fabricating a dual damascene structure.

Referring to FIG. 1A, an etching stop 104, and then a dielectric layer 106 are formed on a provided substrate 100 in sequence, wherein the substrate 100 contains a metal layer 102. A planarization process is performed on the dielectric layer 106 to polish the dielectric layer 106 to a desired thickness, the depth of desired via plugs. Then, another etching stop 108 and dielectric layer 110 are formed on the dielectric layer 106 in sequence, and planarized, wherein the thickness of the dielectric layer 110 equals to the thickness of the conducting wires of the dual damascene structure to be formed in a follow-up process. The dielectric layers 106 and 110 typically include silicon oxide formed by a chemical vapor deposition process. The etching stop 104 includes silicon nitride formed by a chemical vapor deposition process. Another etching stop 108 includes silicon-oxy-nitride formed by a chemical vapor deposition process.

Referring next to FIG. 1B, the dielectric layer 110 is patterned to from openings 112, wherein the positions of the openings 112 are corresponding to the positions of the metal layer 102 underneath. Generally, the openings 112 are formed by first depositing and patterning a photoresist layer (not shown in figure), performing an etching process on the dielectric layer 110 by using the patterned photoresist layer as a mask and using the etching stop 108 as etching end point, and then, removing the photoresist layer.

Referring to FIG. 1C, conventionally, a portion of the etching stop 108 that is exposed within the openings 112 is removed for transferring a pattern onto the etching stop 108. By using another patterned photoresist layer (not shown in figure) and the patterned etching stop 108 as masks, a portion of the dielectric layer 106 beneath the openings 112 and a portion of the dielectric layer 110 around the openings 112 are removed to form via holes 116 and trenches 114. Then, by using an etching stop 108 as a mask, a portion of the etching stop 104 is removed, so that the metal layer 102 is exposed by the via holes 116, the trenches 114 are further widened as well. The trenches 114 and via holes 116 comprise the openings 118 of a dual damascene structure.

Referring next to FIG. 1D, the openings 118 are filled with conductive material to form a dual damascene structure 126. Generally, the dual damascene structure 126 consists of a metal layer 124, such as aluminum, tungsten, or copper, and a barrier/glue layer 122, such as titanium/titanium nitride, wherein the barrier/glue layer 122 is conformal to the openings 118. A planarization process is performed to remove unwanted conductive material from the top of the dielectric layer 110.

As the integration of a semiconductor device is increased, the resistance-capacitance delay regarding to the parasitic capacitance generated by an inter-metal dielectric layer, such as dielectric layers 110 and 106 as shown in FIG. 1D, is worsened. Hence, it is common to utilize low-permittivity dielectric to form inter-metal dielectric in a sub-micron semiconductor fabrication process. Conventionally, the low-permittivity dielectric includes organic materials such as spin-on-polymer (SOP), flare, SILK, and parylene, and inorganic materials, such as HSQ and FSG. Since most low-permittivity dielectrics tend toward absorbing moisture, that causes outgassing phenomena during the process of filling conductive material into the openings 118. The outgassing phenomena happening within the dielectric layers further lead to the occurrence of poisoned trenches and vias that degrades the yield and the electrical property of a device.

SUMMARY OF THE INVENTION

It is therefore an objective of the present invention to provide a method for preventing the occurrence of poisoned trenches and vias in a dual damascene structure.

In accordance with the foregoing and other objectives of the present invention, the invention provides a method that includes performing a densification process, such as an electron-beam process, on the surface of the exposed dielectric layer around the openings before the openings are filled with conductive material. The densified surface of the dielectric layer is able to efficiently prevent the occurrence of poisoned trenches and vias caused by the outgassing phenomena.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new fabricating method of a dual damascene structure for efficiently preventing the occurrence of poisoned trenches and vias, as shown in FIGS. 2A through 2E.

Figure 1A:
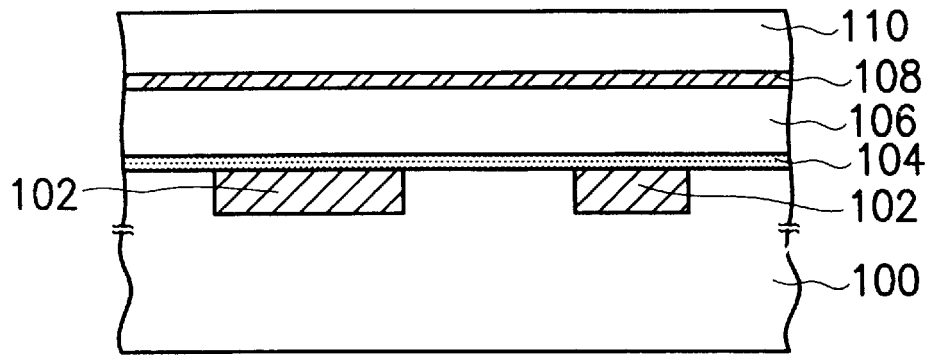
FIGS. 1A through 1D are cross-sectional views showing a conventional fabricating method of a dual damascene structure.
Figure 1B:
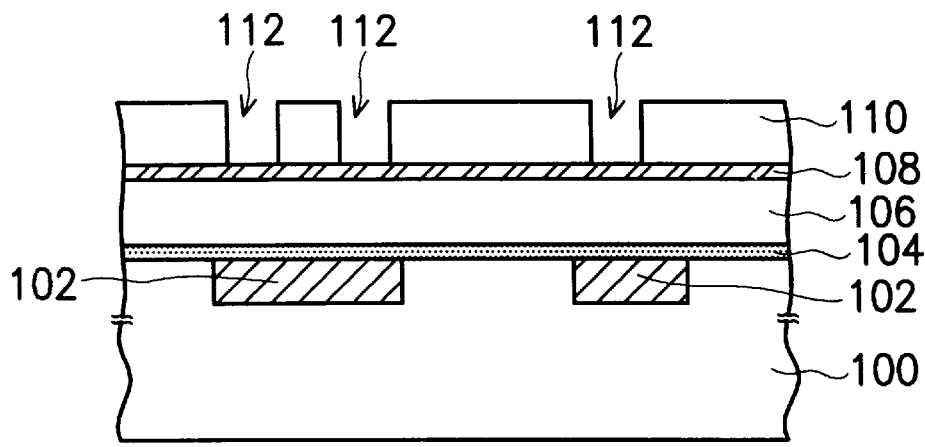
Figure 1C:
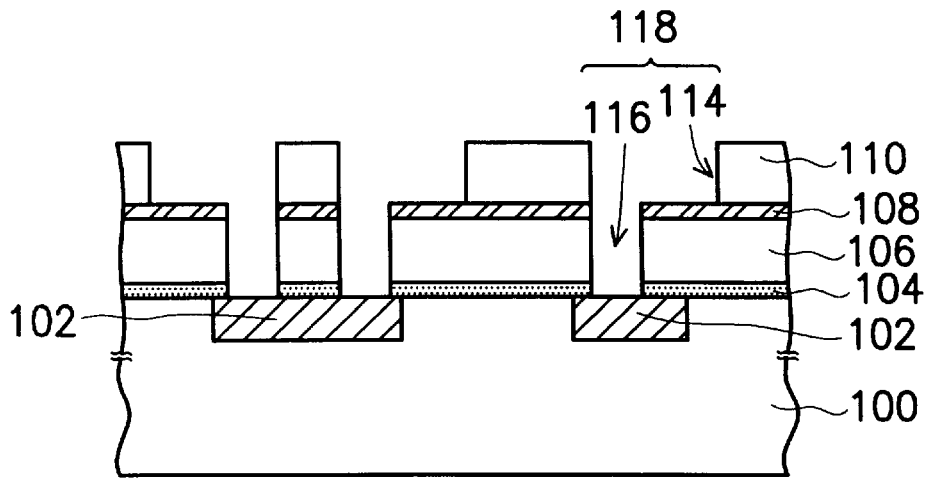
Figure 1D:
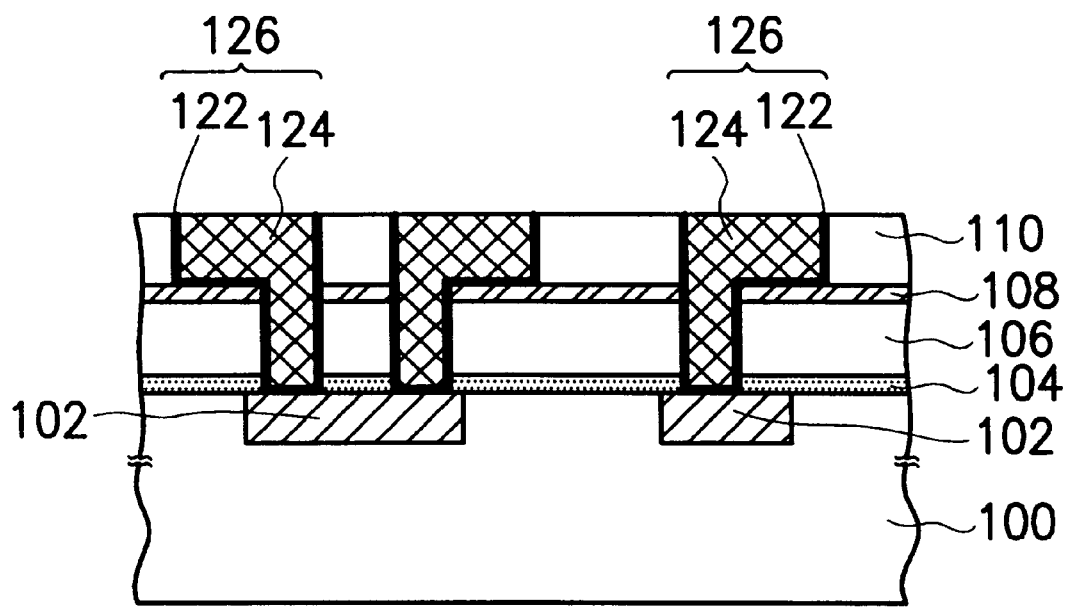
Figure 2A:
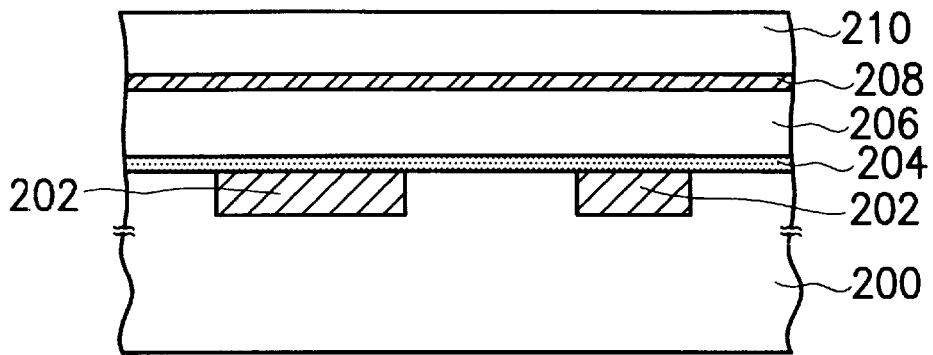
FIGS. 2A through 2E are cross-sectional views showing the fabricating method of a dual damascene structure in a preferred embodiment according to the invention.

Referring to FIG. 2A, an etching stop 204, and then a dielectric layer 206 are formed on a provided substrate 200, wherein the substrate 200 contains a preformed conducting layer 202. A planarization process is performed on the dielectric layer 206, so that the thickness of the remaining dielectric layer 206 is equal to the depth of a desired via plug to be formed in a follow-up process. On the top of the planarized dielectric layer 206, another etching stop 208 and dielectric layer 210 are deposited in sequence, wherein the top surface of the dielectric layer 210 is planarized by performing a planarization process. The thickness of the dielectric layer 210 after the planarization process is equal to the thickness of the conducting wire of the desired dual damascene structure. Generally, the dielectric layers 206 and 210 include silicon oxide, fluorine-doped silicon oxide (FSG), phosphosilicate glass (PSG), and low-permittivity spin on polymer (SOP), such as aromatic-ring polymer, gel, methylsiloxane compounds, and hydrogen silsesquioxane (HSQ). The etching stop 204 includes silicon nitride formed by a chemical vapor deposition process, and the etching stop 208 includes silicon-oxy-nitride formed by a chemical vapor deposition process.

Figure 2B:
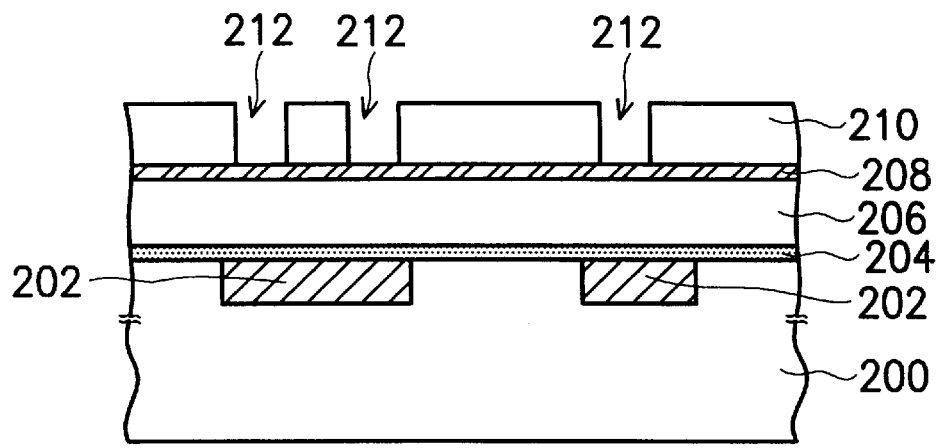

Referring next to FIG. 2B, the dielectric layer 210 is patterned to from openings 212, wherein the positions of the openings 212 are corresponding to the positions of the metal layer 202 underneath. The steps of forming openings 212 include depositing and patterning a photoresist layer (not shown in figure), and, performing an etching process on the dielectric layer 210 by using the patterned photoresist layer as a mask and using the etching stop 208 as etching end point. The photoresist layer is removed after the formation of openings 212.

Figure 2C:
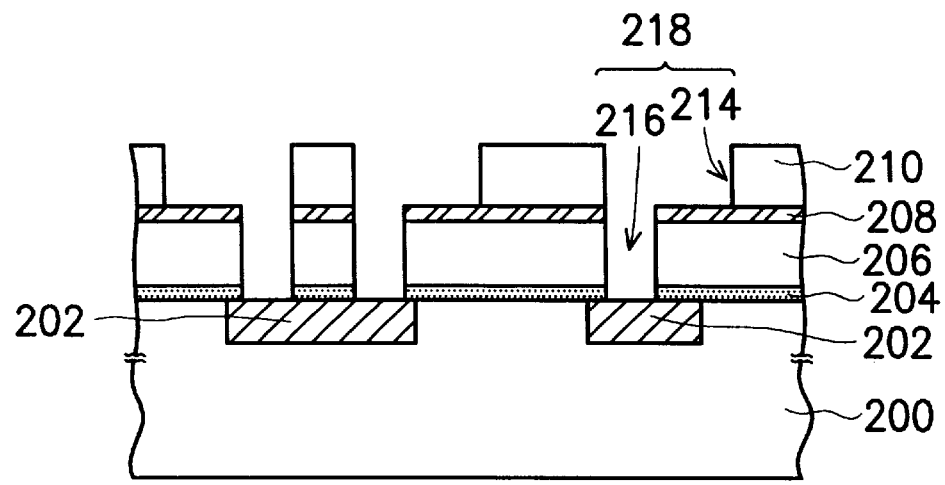

Referring to FIG. 2C, a portion of the etching stop 208 that is exposed within the openings 212 is removed for transferring pattern onto the etching stop 208. By using another patterned photoresist layer (not shown in figure) and the patterned etching stop 208 as masks, a portion of the dielectric layer 206 beneath the openings 212 and a portion of the dielectric layer 210 around the openings 212 are removed to form via holes 216 and trenches 214. Then, by using the etching stop 208 as a mask, a portion of the etching stop 204 is removed, so that the metal layer 202 is exposed by the via holes 216, the trenches 214 are further widened by the etching process as well. The trenches 214 and via holes 216 compose the openings 218 of a dual damascene structure. The etching stop 204 protects the substrate 200 and the conducting layer 202 thereon from being damaged by the etching process performed on the dielectric layer 206 in case of the occurrence of misalignment.

Figure 2D:
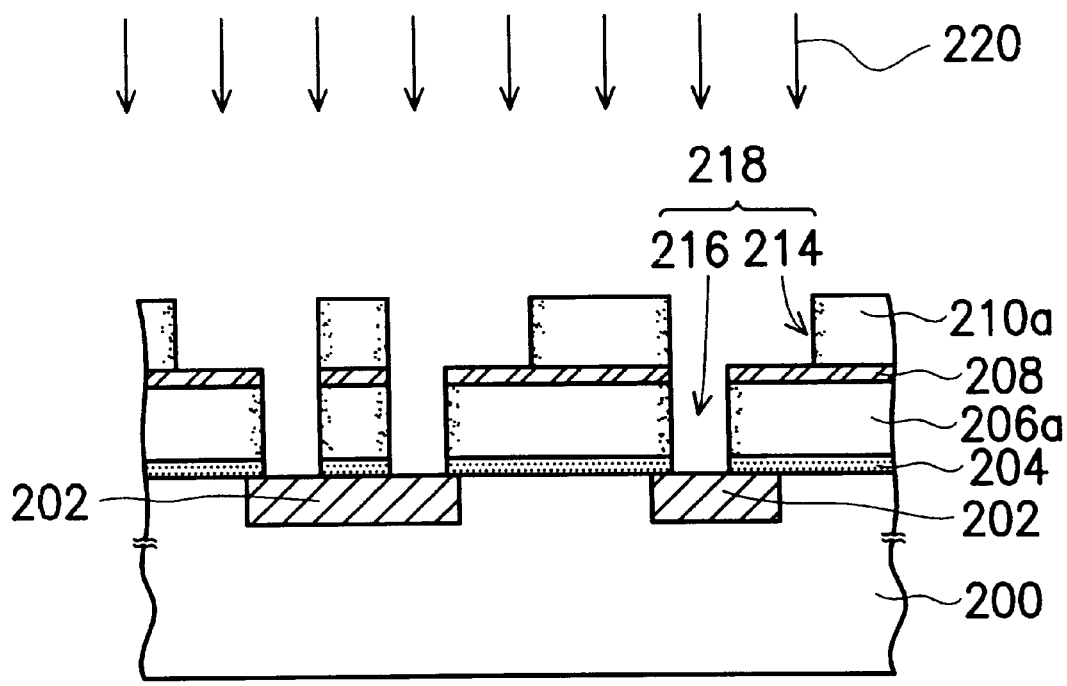

Referring next to FIG. 2D, an electron-beam process is performed on the surface of the dielectric layers 206 and 210 within the openings 218 at a temperature below 600 ° C. for curing the exposed surface to form the densified surface 206a and 210a.

Figure 2E:
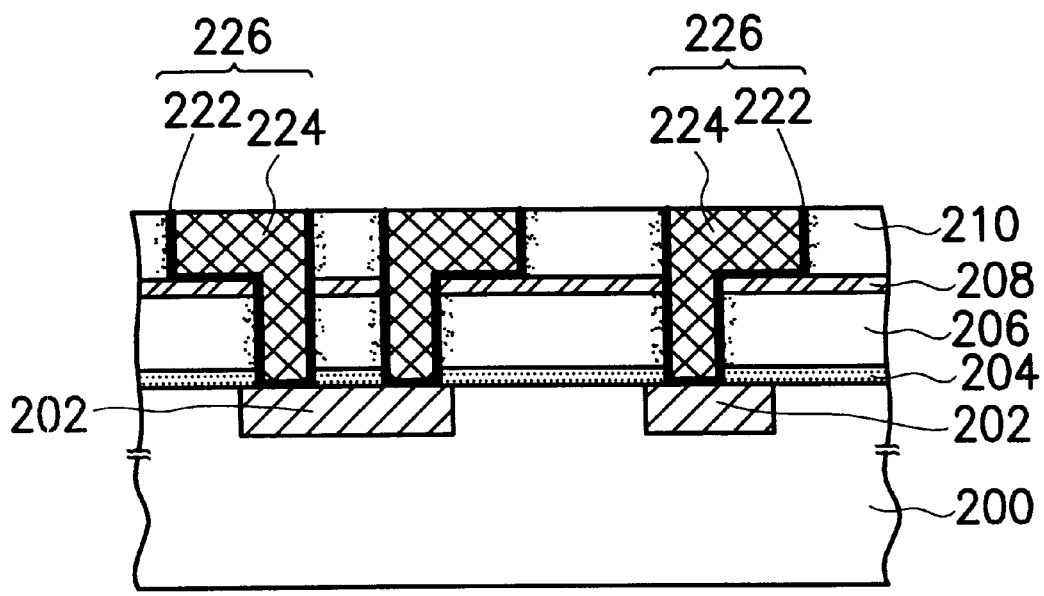

Then, as shown in FIG. 2E, a barrier/glue layer 222 conformal to the substrate 200 is formed on the top of the dielectric layer 210 and the inner surface of openings 218. The barrier/glue layer 222 includes titanium/titanium nitride, tantalum, tantalum nitride, tungsten nitride titanium nitride, or tantalum-silicon-nitride (TaSiN). Then, a metal layer 224 is deposited on the barrier/glue layer 222 and filled into the openings 218, wherein the metal layer 224 includes aluminum, tungsten, copper, or gold. By performing a planarization process, such as a chemical mechanical polishing process, the barrier/glue layer 222 and the metal layer 224 located on the top of the dielectric layer 210 are removed to form a dual damascene structure 226.

Since the electron-beam process performed on the dielectric layers 206 and 210 at a temperature below 600° C. densities the surface of the dielectric layers 206 and 210, the outgassing problems is suppressed. Hence, the occurrence of poisoned trenches and vias is efficiently prevented.

Therefore, it is the specificity of the invention to suppress the parasitic capacitance of a semiconductor device to improve the performance of the device by utilizing low-permittivity dielectrics.

It is also a specificity of the invention to prevent the occurrence of poisoned trenches and vias in the low-permittivity dielectrics to improve the reliability of a semiconductor device.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for preventing poisoned trenches and vias, the method comprising;

providing a substrate, wherein the substrate further comprises a conducting layer;

forming a dielectric layer on the substrate;

forming a trench and a via hole in the dielectric layer, wherein the trench and the via hole form an opening, and wherein the via hole exposes the conducting layer;

performing an electron-beam process to cure and densify the dielectric layer exposed in the opening; and then filling the opening with a conductive material to form a dual damascene structure.

2. The method of claim 1, wherein the dielectric layer includes silicon oxide, fluorine-doped silicon oxide, or phosphosilicate glass.

3. The method of claim 1, wherein the dielectric layer includes low-permittivity materials.

4. The method of claim 1, wherein the dielectric layer includes spin on polymer.

5. The method of claim 1, wherein the dielectric layer includes aromatic-ring polymer, gel, methylsiloxane compounds, or hydrogen silsesquioxane.

6. The method of claim 1, wherein the step of performing an electron-beam process further comprises an operating temperature below 600° C.

7. The method of claim 1, wherein the conductive material comprises;

a barrier/glue layer; and a metal layer.

8. The method of claim 7, wherein the barrier/glue layer includes titanium/titanium nitride, tantalum, tantalum nitride, tungsten nitride, titanium nitride, or tantalum-silicon-nitride (TaSiN).

9. The method of claim 7, wherein the metal layer includes aluminum, tungsten, or copper.

10. A method for preventing poisoned trenches and vias, the method comprising;

providing a substrate, wherein the substrate further comprises a conducting layer;

forming a first etching stop, a first dielectric layer, a second etching stop, and a second dielectric layer on the substrate in sequence;

patterning the second dielectric layer to form an opening by using the second etching stop as etching end point, wherein the opening is located correspondingly to the conducting layer underneath;

removing a portion of the second etching stop exposed within the opening for transferring a pattern to the second etching stop;

removing a portion of the second dielectric layer and a portion of the first dielectric layer while using the first etching stop as etching end point and using the second etching stop as a mask, so as to transfer the opening to the first dielectric layer to expose the first etching stop and widening the opening to form a trench on the second dielectric layer, wherein the opening and the trench form a dual damascene opening;

removing a portion of the first etching stop exposed within the opening to expose the conducting layer;

performing an electron-beam process to cure and densify a surface of the first and the second dielectric layers exposed in the dual damascene opening; and then filling the dual damascene opening with a conductive material to form a dual damascene structure.

11. The method of claim 10, wherein the first etching stop includes silicon nitride.

12. The method of claim 10, wherein the second etching stop includes silicon-oxy-nitride.

13. The method of claim 10, wherein the first dielectric layer and the second dielectric layer include silicon oxide, fluorine-doped silicon oxide, or phosphosilicate glass.

14. The method of claim 10, wherein the first dielectric layer and the second dielectric layer include low-permittivity materials.

15. The method of claim 10, wherein the first dielectric layer and the second dielectric layer include spin on polymer.

16. The method of claim 10, wherein the first dielectric layer and the second dielectric layer include aromatic-ring polymer, gel, methylsiloxane compounds, or hydrogen silsesquioxane.

17. The method of claim 10, wherein the step of performing an electron-beam process further comprises an operating temperature below 600° C.

18. The method of claim 10, wherein the conductive material comprises;

a barrier/glue layer; and a metal layer.

19. The method of claim 18, wherein the barrier/glue layer includes titanium/titanium nitride, tantalum, tantalum nitride, tungsten nitride, titanium nitride, or tantalum-silicon-nitride (TaSiN).

20. The method of claim 18, wherein the metal layer includes aluminum, tungsten, copper, or gold.

* * * * *